United States Patent
Lundquist et al.

(10) Patent No.: US 11,114,274 B2
(45) Date of Patent: Sep. 7, 2021

(54) METHOD AND SYSTEM FOR TESTING AN INTEGRATED CIRCUIT

(71) Applicant: Carl Zeiss SMT GmbH, Oberkochen (DE)

(72) Inventors: Theodore Lundquist, Milpitas, CA (US); Baohua Niu, Portland, OR (US)

(73) Assignee: Carl Zeiss SMT GmbH, Oberkochen (DE)

( * ) Notice: Subject to any disclaimer, the term of this patent is extended or adjusted under 35 U.S.C. 154(b) by 24 days.

(21) Appl. No.: 16/725,287

(22) Filed: Dec. 23, 2019

(65) Prior Publication Data

US 2021/0193431 A1    Jun. 24, 2021

(51) Int. Cl.
*H01J 37/244*    (2006.01)
*H01J 37/28*    (2006.01)

(52) U.S. Cl.
CPC ............ *H01J 37/244* (2013.01); *H01J 37/28* (2013.01); *H01J 2237/2445* (2013.01); *H01J 2237/2448* (2013.01); *H01J 2237/2817* (2013.01)

(58) Field of Classification Search
CPC .. H01J 37/244; H01J 37/28; H01J 2237/2448; H01J 2237/2445; H01J 2237/2817; H01J 2237/2808
USPC ........................................................ 250/310
See application file for complete search history.

(56) References Cited

U.S. PATENT DOCUMENTS

| | | | | |
|---|---|---|---|---|
| 3,790,781 A | * | 2/1974 | Horl | H01J 37/244 250/310 |
| 4,117,323 A | * | 9/1978 | Greer | H01J 37/22 250/311 |
| 4,238,686 A | * | 12/1980 | Chin | G01R 31/2653 250/492.2 |
| 5,010,253 A | * | 4/1991 | Braglia | G01N 23/2254 250/399 |
| 10,629,409 B2 | * | 4/2020 | Vaske | H01J 37/26 |
| 10,651,009 B2 | * | 5/2020 | Hoogenboom | H01J 37/228 |
| 2012/0292503 A1 | * | 11/2012 | Phifer, Jr. | H01J 37/222 250/307 |
| 2013/0032713 A1 | * | 2/2013 | Barbi | G01T 1/2018 250/307 |
| 2013/0140459 A1 | * | 6/2013 | Galloway | H01J 37/28 250/310 |
| 2013/0193342 A1 | * | 8/2013 | Berney | H01J 37/28 250/399 |
| 2014/0197310 A1 | * | 7/2014 | Hill | G01N 23/2254 250/307 |
| 2017/0133198 A1 | * | 5/2017 | Kruit | H01J 37/20 |
| 2018/0197713 A1 | * | 7/2018 | Bobrov | H01J 37/18 |
| 2018/0358199 A1 | * | 12/2018 | Kumamoto | H01J 37/28 |
| 2019/0198288 A1 | * | 6/2019 | Maazouz | H01J 37/261 |
| 2020/0035447 A1 | * | 1/2020 | Kruit | H01J 37/244 |
| 2020/0363349 A1 | * | 11/2020 | Klusacek | G01N 23/2251 |

* cited by examiner

*Primary Examiner* — David A Vanore
(74) *Attorney, Agent, or Firm* — Fish & Richardson P.C.

(57) ABSTRACT

A method for analyzing an integrated circuit includes: applying an electric test pattern to the IC; delivering a stream of primary electrons to a back side of the IC on an active region to a transistor of interest, the active region including active structures such as transistors of the IC; detecting light resulting from cathodoluminescence initiated by secondary electrons in the IC; and analyzing the detected light regarding a correlation with the electric test pattern applied to the IC. A system for analyzing an IC is provided.

28 Claims, 4 Drawing Sheets

METHOD AND SYSTEM FOR TESTING AN INTEGRATED CIRCUIT

FIELD

The disclosure relates to a method and a system for testing an integrated circuit.

BACKGROUND

For design, debugging, and performance validation of integrated circuits probing tools and technologies have been in use for many years in IC development, validation and manufacturing. For yield analysis or fault detection in a design validation process a detailed functional analysis of individual active devices of an IC is desirable-like transistors, gates or the like. Also, for timing analysis it is important that timing signals be probed on-chip to extract waveforms to compare the measured results with design expectations for timing of sensitive circuits.

Nowadays, a widely-used method for integrated circuit testing is optical-based probing of integrated circuits. A laser beam having a wavelength near the band gap of the semiconductor to be probed is focused on an active region of the semiconductor through its back side. Amplitude modulation in the reflected laser beam from the active region is detected and is then attributed to the electric field in the active region of the semiconductor.

The resolution of optical beam probing is generally diffraction-limited by the used wavelength and the numerical aperture of the used optical system. Even by using a high numerical aperture optical system, the wavelength of the probing laser can be in the range of e.g. 1064 nm or 1340 nm. In this wavelength range the most important semiconductor Si has a sufficient low absorption. Also, shorter wavelengths have a higher probability of generating electron-hole pairs which can contribute negatively to the measurement results. Thus, it is difficult to shift the resolution of the optical probing system below 700 nm. On the other hand, active structures in modern ICs are of the range of 10 nm or smaller. In consequence, optical beam probing is failing to be viable for the ever-decreasing features sizes of modern ICs.

SUMMARY

The present disclosure seeks to provide a method and a system for analyzing an integrated circuit that has the potential to resolve structures smaller than the diffraction limit of present optical beam probing systems.

The present disclosure also seeks to improve the resolution of existing IC testing.

Further, the present disclosure seeks to allow for a high speed IC testing apparatus with single active component resolution.

A method for analyzing an integrated circuit (IC) according to the present disclosure includes the steps:
  applying an electric test pattern to the IC;
  delivering a stream of primary electrons to a back side of the IC in an active region, the active region including active structures such as transistors, diodes or the like of the IC;
  detecting a light resulting from cathodoluminescence (CL) initiated by secondary electrons in the IC;
  analyzing the detected light regarding a correlation with the electric test pattern applied to the IC.

Cathodoluminescence is an optical and electrical phenomenon. Electrons impacting on a material cause the emission of photons, i.e. the cathodoluminescence light. Cathodoluminescence is the inverse effect to the photoelectric effect, in which electron emission is induced by irradiation with photons. The generation of cathodoluminescence photons and the properties of the cathodoluminescence photons is influenced by the electric field present in the active structure. In particular, the local voltage of an IC feature interacts with the electron-hole pair generated in the vicinity of the active structure and thus has an influence on the cathodoluminescence photon(s) resulting from a recombination of the secondary electron with the hole.

The measured cathodoluminescence light emission is correlated with the local electric field of the active structure or the active feature under investigation. A modulation of the local electric field by the electric test pattern applied to the IC influences the recombination processes of secondary electrons and is thus visible in the cathodoluminescence light detected. The electric test pattern is designed to activate active IC structures of interest and to compare the cathodoluminescence output with design specifications or other aspects the active structure or the IC as a whole has to meet.

In some embodiments the step of detecting a light includes at least one of the following: number of photons, photon wavelength, polarization, angle. The number of photons, i.e. the cathodoluminescence light intensity, a key parameter and is correlated inter alia with the local electric field of the active structure under investigation. A variation of the local electric field, i.e. a voltage variation, of an active structure or a part thereof by the applied electric test pattern or waveform transfers to a variation of the number of cathodoluminescence photons, i.e. a variation of the cathodoluminescence light intensity. Other parameters like the photon wavelength, the photon polarization and/or the emission angle may be used in addition or instead to analyze the performance of the active structure under investigation during the application of an electric test pattern.

Optionally, the electron beam has a resolution about the size of the active structure under investigation, e.g. of a transistor or a diode, and less than the spacing between active structures of the IC. Electron beams can be focused to a spot size of about 0.4 nm to 5 nm. Further, the area of the IC covered by the electron beam can be less than the spacing between transistors. This allows to analyze the IC on an active structure level or even below, i.e. individual parts or portions of the active structure of interest. In consequence, it is not necessary to provide any imaging optics that would be able to collect any positional information regarding the emitted cathodoluminescence light. The spatial resolution is provided by the positional information of the electron beam. Only collecting the light emitted by the active structure under test regarding intensity (and/or wavelength, polarization, angle if desired) is involved.

The time lag between the generation of an electron-hole pair by the electron beam inside or in the vicinity of the active structure and the emission of cathodoluminescence light is in the Picosecond range and is thus neglectable.

According to one embodiment, the energy of the electron beam is equal to or lower than 500 eV. Electrons having an energy equal to or lower than 500 eV are unlikely to cause substantial damage to the material they are impinging. Also, with energies equal to or below 500 eV the resulting cathodoluminescence light is of substantial intensity.

Every change of state of an active structure within the IC, e.g. switching of a transistor, is a possible source for cathodoluminescence light emission and may be interesting for the analysis the operation of the IC. During operation of the IC, there are also light emissions not correlated with such changes of state. In order to improve the distinction between the cathodoluminescence light emissions useful for the analysis of the operation of the IC from other cathodoluminescence light emissions, a bandpass filter may be used. The wavelength of cathodoluminescence light generated in silicon by a transistor switching (or other state changes) is in the range of 500 nm to 600 nm and is much shorter than the wavelength released from primary electrons.

A further embodiment of the method includes the additional step of detecting secondary electrons released from the IC. The cathodoluminescence light is relevant for establishing a time correlation between the input electric test pattern and the reactions of individual active structures onto the test pattern by emitting cathodoluminescence photons. The cathodoluminescence photons can be detected with appropriate photon detectors like photo diodes or the like, e.g. Si—PIN detectors. This allows for a high speed detection of the cathodoluminescence light, e.g. in the 10 GHz range. On the other hand, the secondary electrons released from the semiconductor material may additionally provide an intensity signal that depends on the electrical potential at the spot where the electron beam reaches the semiconductor material. The electrical potential can be influenced by active structures in the semiconductor and in particular by the state or by a change of state of an active structure. The secondary electron intensity may additionally give information to the detected cathodoluminescence light signal.

The step of detecting secondary electrons may include focusing/directing the secondary electrons onto a detector.

According to an advantageous embodiment the step of detecting cathodoluminescence light includes using a single mirror or a two mirror objective design. A single mirror design may involve a paraboloid or an ellipsoid reflective surface. A two mirror design may be based on a Cassegrain reflector arrangement or a Schwarzschild reflector arrangement. The two reflector design following a Cassegrain setup is particularly beneficial for integrating the detector light path into the electron beam source.

In certain embodiments, the step of applying a test pattern may include stimulating the IC electrically with an IC testing device. An IC testing device may be an automatic test equipment (ATE) to perform tests on the IC. The test pattern applied to the IC under test may include a constant trigger signal. Nowadays, the interesting operation frequency is in the 10 GHz range. Accordingly, the rise and fall times of individual pulses should be in the order of 100 picoseconds or below. Alternatively to applying the trigger signal in form of a test pattern by the IC testing device the internal clock of the IC may be used.

Optionally, the step of applying a test pattern includes operating the IC such that at least one transistor of the IC switches. If the individual active structure, e.g. the transistor, is not working at all or is not working according to design, the malfunction will transform into a correspondence in timing of the cathodoluminescence light emission. This makes it possible to detect malfunctioning active structures on an IC by detecting the corresponding cathodoluminescence light.

The applied electric test pattern may be a waveform that is generated externally, e.g. by a 20 GHz oscilloscope. The analysis of the cathodoluminescence light emission, e.g. the signal of a correspondingly fast photo detector, can be performed by a similar oscilloscope or e.g. by an arbitrary waveform generator, a digital signal waveform generator and delay box.

An embodiment of the method additionally includes the step of partially thinning the IC semiconductor substrate in the area of interest and delivering the electron beam to the thinned portion of the IC. The excitation volume of the low energy electron beam is about 5 nm lateral diameter and about 100 nm depth. For reaching active portions of active structures in the IC it is desirable to deliver the electron beam from the back side and to thin the semiconductor material above the active structures accordingly. Thinning can be done mechanically, e.g. by lapping, dimple grinding or chemically, e.g. by etching.

Optionally, the step of thinning includes thinning the substrate such that the substrate is electron transparent at the transistor of interest of the IC.

The thinned portion may cover one or more transistors of interest.

In some embodiments, the step of analyzing includes analyzing a complex waveform to understand its timing relative to the stimulation trigger.

Optionally, the step of analyzing includes analyzing the timing variation of Cathodoluminescence photons. The cathodoluminescence light emission changes depending on the local voltage prevailing at the active region under investigation. The cathodoluminescence light results from a recombination of an electron hole pair. Electron hole pairs are produced by the electrons delivered as primary electrons to the active region. The local voltage may separate electrons and holes preventing a recombination. As a result, no cathodoluminescence would occurs. On the other hand, the local voltage may facilitate a recombination and in consequence an increased cathodoluminescence would be visible. The recombination time for an electron-hole pair is about a few picoseconds and does not limit the band width for analyzing the IC in the bandwidth range.

In certain embodiments, the method includes a step of scanning an area of interest of the IC. To this end, the electron beam can be moved across the area of interest and the cathodoluminescence light intensities are measured. The correlation between the measured intensities and the position of the electron beam allows to form an image showing the cathodoluminescence light distribution. If the beam is scanned slowly the timing waveform of other transistors maybe detected and used to determine which transistors are working and which are not.

The application of an electric test pattern, the delivering of a stream of electrons, the detection of the cathodoluminescence light can generally be performed in a loop to improve the signal to noise ratio by repetition.

The above-mentioned objects are also met by a system for analyzing an integrated circuit, wherein the system includes: an IC holding structure, which delivers the electrical stimulation, an electron beam source, a cathodoluminescence detector, an IC testing device, and a control device adapted to control the electron beam source, the cathodoluminescence detector and the IC testing device such that an electric test pattern applied to the IC can be correlated with a signal of the cathodoluminescence detector.

The electron beam source, e.g. a scanning electron microscope, may include—among others—an electron source, e.g. an electron gun, an anode, a condensing and aligning apparatus, and a deflection apparatus forming an electron beam column. The deflection apparatus is adapted for translating the electron beam across the substrate. Such a scanning electron microscope set up may be used in a high resolution low voltage mode, i.e. with voltages between 200 eV and 1 keV. A typical working distance could be 2 mm.

The field of view of the electron beam source can be about one micrometer with a resolution of a few nanometers, i.e. below 5 nm.

Optionally, the control device is adapted to scan the electron beam over a surface portion of the IC.

Optionally, the optical imaging system for detecting the cathodoluminescence light emission is integrated into the electron beam column. Optionally, a Cassegrain or Schwarzschild cathodoluminescence light collecting and collimating reflector set up may be used.

The system may also include a secondary electron detector for imaging to navigate the beam to the transistor of interest the beam

BRIEF DESCRIPTION OF THE DRAWINGS

Various features and advantages of the present disclosure may be more readily understood with reference to the following detailed description taken in conjunction with the accompanying drawings, in which.

DETAILED DESCRIPTION

Figure 1:
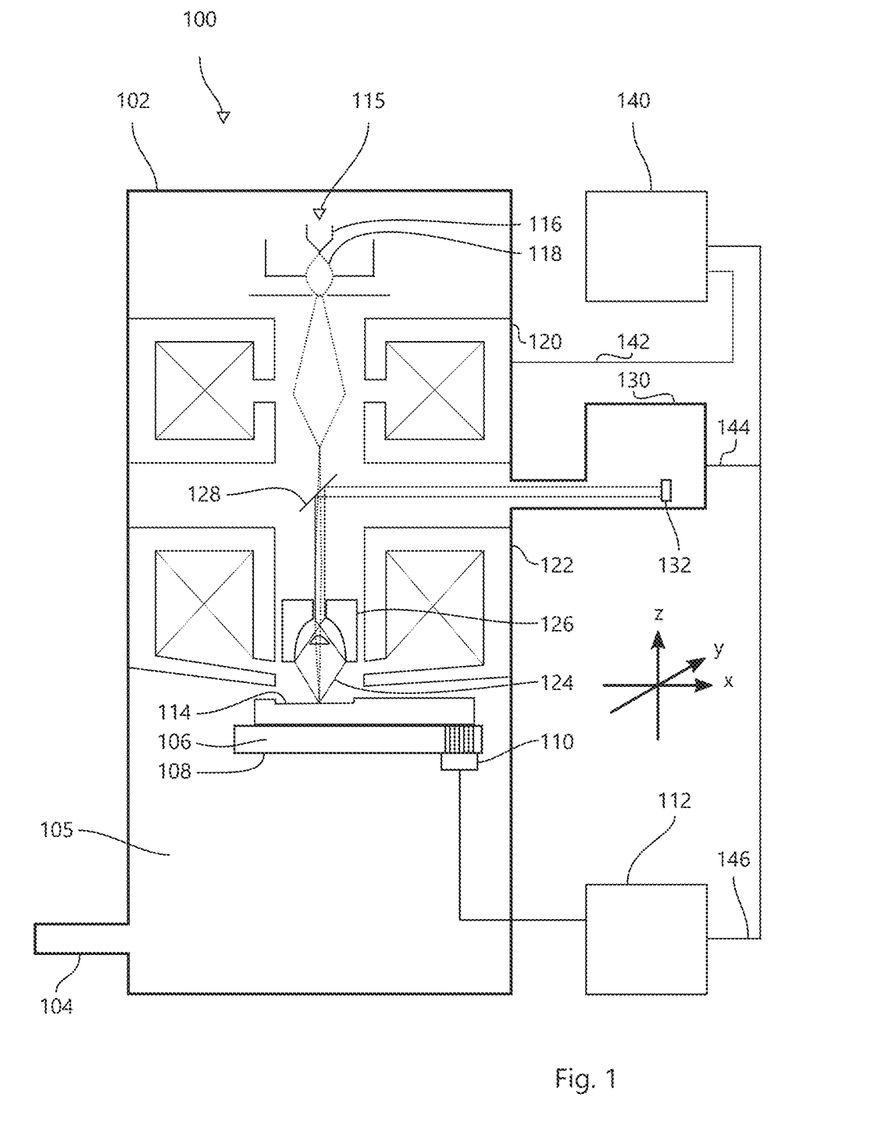
FIG. 1 shows a schematic cross sectional view of a system for testing an IC.

FIG. 1 shows a schematic cross sectional view of a system 100 for testing an IC. The actual size of individual components relative to each other is not to scale and may differ in an actual embodiment.

The system 100 includes an outer housing 102 that is adapted to provide an appropriate high vacuum inside. A vacuum outlet 104 is symbolically provided—the vacuum concept for a real system 100 may be more sophisticated and may include several pressure levels and vacuum pumps.

A device under test (DUT) 106, which is not part of the system 100 itself, is placed inside the housing 102 on a sample holder 108. The sample holder 108 is adapted to provide a coarse positioning of the DUT 106 as well as to provide for cooling and/or heating, as desired.

The sample holder 108 also provides for an electric connection of the DUT 106 by appropriate test lines 110. The test lines 110 are fed through the housing 102 and are connected to an automated test equipment (ATE) 112.

The DUT 106 is flip-chip mounted on the sample holder 108 and has a thinned back side 114.

The system 100 further includes within the vacuumed inside an electron beam column 115 including an electron source 116 producing an electron beam 118. The electron beam 118 may have an energy of about 200 eV up to 1 keV for the present intended application. The electron beam 118 is focused by one or two condenser lenses 120. The condenser lenses 120 may be magnetic or electrostatic lenses. The system 100 further includes a scanning unit 122 and/or deflector plates for deflecting the electron beam 118 in an x- and y-direction.

The electron beam 118 impinging on the back side 114 of the DUT 106 releases or generates cathodoluminescence light, symbolized by the light rays 124. The cathodoluminescence light 124 is radiated in all spatial directions and is collected by a catoptric lens 126. The lens 126 is designed to provide a high numerical aperture. The collection aperture of the lens 126 can be up to 40° half angle. The wavelength of the cathodoluminescence light in silicon is in the range of 500 nm to 600 nm and can be collected by the lens 126 inside the electron beam column 115. After the collimating lens 126 in z-direction, a mirror 128 is arranged for diverting the cathodoluminescence light 124 out of the electron beam column 115 to a detector unit 130. The detector unit 130 includes a fast detector 132 such as a fast PIN diode detector allowing to detect signals up to the 10 GHz range.

The detector unit 130 may additionally include analyzing tools for determining other light properties besides the intensity. These properties may include polarization, wavelength or the like.

The system 100 further includes a control unit 140. The control unit 140 is connected with the electron beam column 115, see line 142, with the detection unit 130, see line 144 and with the ATE 112, see line 146. The control unit is adapted to control the position of the electron beam 118, any waveform generated by the ATE 112 and submitted to the DUT 106, and to receive a signal correlated with the generated cathodoluminescence light 124, detected in the detection unit 130 by the detector 132.

The process for testing a DUT 106 like an IC is as follows:

The DUT 106 is inserted into the vacuum chamber 105 onto the sample holder 108, after its back side 114 has been thinned to the desired depth. The device under test 106 is operated by the ATE 112 through the lines 110. In particular, certain test patterns are run on the device 106 to evaluate the functionality of certain active structures on the device 106 and/or to analyze timing of the active structures of the device 106. The electron beam 118 is generated and focused onto an area of the device 106 of interest. The electron beam 118 impinging on the back side 114 enters the semiconductor material to a depth of about 100 nm in the given energy range. The lateral diameter for excitation is about 5 nm. In this volume, the cathodoluminescence light is generated and leaves the semiconductor material over the back side 114 of the DUT 106. The catoptric collimation lens 126 collects the cathodoluminescence light 124 and directs it to the fast photon detector 132.

In the control unit 140, the waveform applied by the ATE 112 and the corresponding intensity waveform as provided by the detection unit 130 can be correlated. In combination with the position of the electron beam 118—this information is provided by the electron column 115 to the control unit 140—the operation of an active structure can be closely monitored.

By the ATE 112, the active structures of interest of the DUT 106 can be addressed by applying the appropriate waveforms. In particular, the operation of the active structure of interest can be monitored in real time, since the detection of cathodoluminescence light is at least as fast as the operation of the active structure.

The electron beam column 115 allows for a field of view of 1 μm radius as well as the navigation of the beam. Within this area, the electron beam 118 can be directed to different positions and switched between them. The control unit 140 can measure the time delay for the difference of the waveform applied by the ATE 112 to the DUT 106. This allows to analyze the time difference between different active structures, which might be within a specified maximum allowed time difference. This allows to measure whether signals on the DUT 106 (e. g. an IC) are synchronous or whether they deviate so much that the IC is not able to run a specified high frequency. This allows to find out the maximum frequency up to which a device 106 can be operated.

Figure 2:
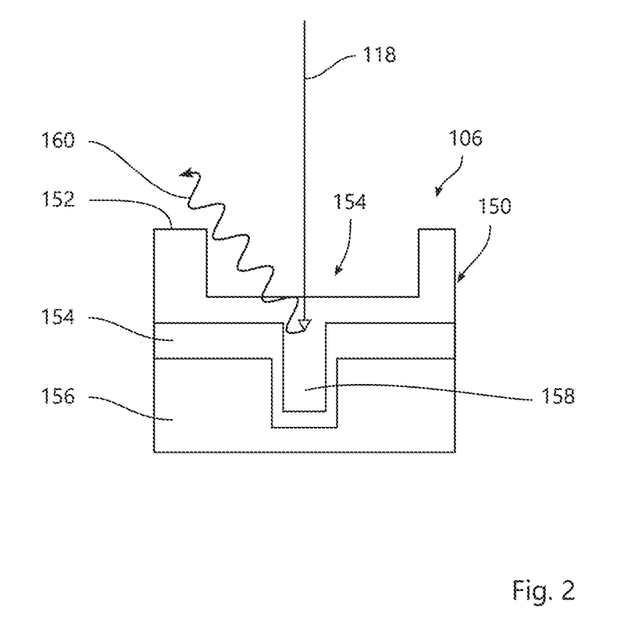
FIG. 2 shows a basic schematic sketch of a cathodoluminescence event in a FinFET device.

FIG. 2 shows the DUT 106 in more detail, but still in a very basic and schematic drawing. The DUT 106 is in this case in this embodiment of a FinFET, but any other semiconductor device can be analysed with the present disclosure. The DUT 106 includes as a FinFET 150 a silicon substrate 152. This backside has been thinned in an area of interest 154 to a thickness below 100 nm to allow access of the election beam 118 to relevant areas of the FinFET device 150. The device 150 also includes an oxide layer 154, a gate 156. The gate 156 may be a metal gate controlling the operation of the thin 158. Electrons from the electron beam 118 can penetrate into the thin 158 and create electron hole pairs, which then combine to admit photons 116 as a cathodoluminescence light, which can then be detected. The voltage variations in the fin 158 will enable the local waveform to be traced out. The intensity of the cathodoluminescence light and its wavelength are expected to vary as per the voltage.

Figure 3:
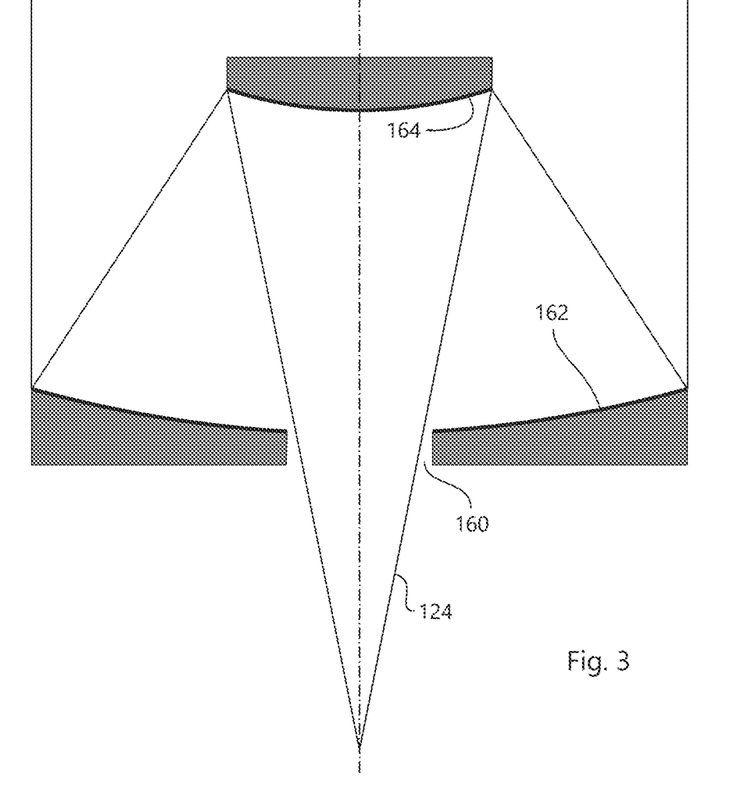
FIGS. 3 and 4 show lens arrangements for collecting cathodoluminescence light.

FIG. 3 shows by schematic Cassegrain lens arrangement. The admitted cathodoluminescence light 124 passes through a first stop 160 within a reflective surface 162 and impinges on a second reflective surface 164. The second reflective surface 164 is of a hyperboloid shape and reflects the cathodoluminescence light 124 to the first reflective surface 162, which has a paraboloid shape. The Cassegrain lens arrangement allows a small field of view, a high resolution and a long effective focal length.

Figure 4:
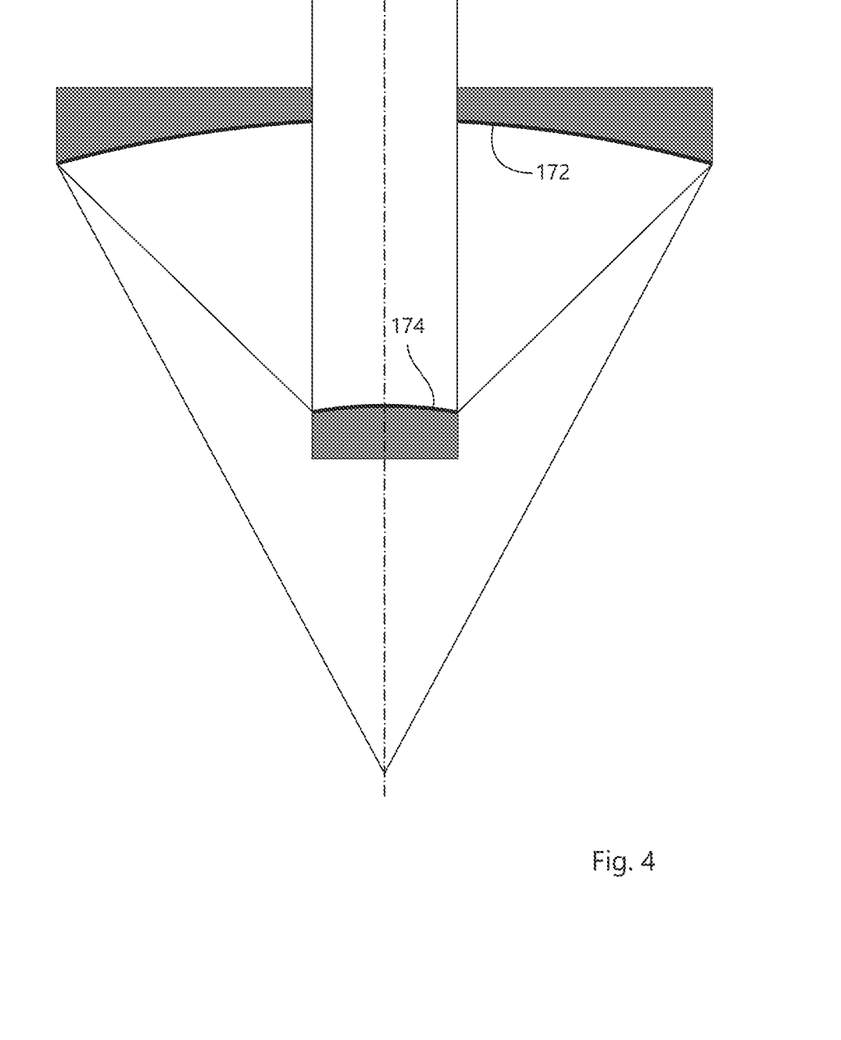

FIG. 4 shows an alternative lens arrangement, namely a Schwarzschild set up. The cathodoluminescence light is reflected on a primary reflective surface 172 and impinges on a secondary reflective surface 174.

Of course, other suitable lens arrangements may be used with the disclosure.

What is claimed is:

1. A method, comprising:
    a) applying an electric test pattern to an integrated circuit (IC);
    b) delivering a beam primary electrons to a side of the IC on an active region comprising active structures of the IC;
    c) detecting light resulting from cathodoluminescence initiated by secondary electrons in the IC; and
    d) analyzing the detected light to correlate the detected light with the electric test pattern applied to the IC,
    wherein the electron beam has a resolution, the resolution is about a size of the active structure, and the resolution is less than a spacing between active structures of the IC.

2. The method of claim 1, wherein detecting the light comprises at least one member selected from the group consisting of detecting a number of photons of the light, detecting photon wavelengths of the light, detecting a polarization of the light, and detecting an angle of the light.

3. The method of claim 1, wherein an area of the IC covered by the electron beam is less than a spacing between transistors of the IC, and/or wherein an energy of the electron beam is equal or lower than 500 eV.

4. The method of claim 1, further comprising detecting secondary electrons released from the IC.

5. The method of claim 1, wherein c) comprises using at least one mirror to divert the catholuminescence to a detector.

6. The method of claim 1, wherein applying a test pattern comprises operating the IC so that at least one transistor of the IC is switching.

7. The method of claim 1, further comprising at least partially thinning a semiconductor substrate of the IC, and delivering the electron beam to the thinned portion of the IC.

8. The method claim 7, wherein the thinned portion covers one or more transistors.

9. The method of claim 1, wherein analyzing comprises analyzing a timely variation of photons.

10. The method of claim 1, further comprising scanning an area of interest of the IC.

11. The method of claim 1, further comprising performing a)-c) in a loop to improve the signal to noise ratio by repetition.

12. The method of claim 1, wherein the active structures of the IC comprise transistors.

13. A method, comprising:
    analyzing cathodoluminescence light emitted from integrated circuit (IC) due to the delivery of a beam of primary electrons to a side of the IC on an active region comprising active structures of the IC while applying an electric test pattern to the IC, thereby correlating the cathodoluminescence light with the electric test pattern applied to the IC,
    wherein the electron beam has a resolution, the resolution is about a size of the active structure, and the resolution is less than a spacing between active structures of the IC.

14. The method of claim 13, further comprising detecting the cathodoluminescence light by a process which comprises at least one member selected from the group consisting of detecting a number of photons of the light, detecting photon wavelengths of the light, detecting a polarization of the light, and detecting an angle of the light.

15. The method of claim 13, wherein analyzing the cathodoluminescence light comprises analyzing a timely variation of photons.

16. A method, comprising:
    analyzing cathodoluminescence light emitted from integrated circuit (IC) due to the delivery of a beam of primary electrons to a side of the IC on an active region comprising active structures of the IC while applying an electric test pattern to the IC, thereby correlating the cathodoluminescence light with the electric test pattern applied to the IC,
    wherein analyzing the cathodoluminescence light comprises analyzing a timely variation of photons.

17. The method of claim 16, further comprising detecting the cathodoluminescence light by a process which comprises at least one member selected from the group consisting of detecting a number of photons of the light, detecting photon wavelengths of the light, detecting a polarization of the light, and detecting an angle of the light.

18. A method, comprising:
    a) applying an electric test pattern to an integrated circuit (IC);
    b) delivering a beam primary electrons to a side of the IC on an active region comprising active structures of the IC;
    c) detecting light resulting from cathodoluminescence initiated by secondary electrons in the IC; and
    d) analyzing the detected light to correlate the detected light with the electric test pattern applied to the IC,
    wherein analyzing comprises analyzing a timely variation of photons.

19. The method of claim 18, wherein detecting the light comprises at least one member selected from the group consisting of detecting a number of photons of the light, detecting photon wavelengths of the light, detecting a polarization of the light, and detecting an angle of the light.

20. The method of claim 18, wherein:
    the electron beam has a resolution;

the resolution is about a size of the active structure, the resolution is less than a spacing between active structures of the IC; and an area of the IC covered by the electron beam is less than a spacing between transistors of the IC, and/or wherein an energy of the electron beam is equal or lower than 500 eV.

21. The method of claim 18, further comprising detecting secondary electrons released from the IC.

22. The method of claim 18, wherein c) comprises using at least one mirror to divert the catholuminescence to a detector.

23. The method of claim 18, wherein applying a test pattern comprises operating the IC so that at least one transistor of the IC is switching.

24. The method of claim 18, further comprising at least partially thinning a semiconductor substrate of the IC, and delivering the electron beam to the thinned portion of the IC.

25. The method claim 24, wherein the thinned portion covers one or more transistors.

26. The method of claim 18, further comprising scanning an area of interest of the IC.

27. The method of claim 18, further comprising performing a)-c) in a loop to improve the signal to noise ratio by repetition.

28. The method of claim 18, wherein the active structures of the IC comprise transistors.

\* \* \* \* \*

UNITED STATES PATENT AND TRADEMARK OFFICE
CERTIFICATE OF CORRECTION

Page 1 of 1

PATENT NO. : 11,114,274 B2
APPLICATION NO. : 16/725287
DATED : September 7, 2021
INVENTOR(S) : Theodore Lundquist and Baohua Niu It is certified that error appears in the above-identified patent and that said Letters Patent is hereby corrected as shown below:

In the Specification

Column 5, Line 13, after "beam" insert -- . --;

In the Claims

Column 7, Line 60, Claim 5, delete "catholuminescence" and insert -- cathodoluminescence --;

Column 8, Line 1, Claim 8, after "method" insert -- of --;

Column 9, Line 11, Claim 22, delete "catholuminescence" and insert -- cathodoluminescence --;

Column 9, Line 19, Claim 25, after "method" insert -- of --.

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*